United States Patent
Trujillo et al.

(10) Patent No.: US 11,876,057 B1
(45) Date of Patent: Jan. 16, 2024

(54) SPLIT SOURCE DRAIN TRANSISTOR

(71) Applicant: Honeywell Federal Manufacturing & Technologies, LLC, Kansas City, MO (US)

(72) Inventors: Joshua Joseph Trujillo, Overland Park, KS (US); Payman Zarkesh-Ha, Albuquerque, NM (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 18/150,942

(22) Filed: Jan. 6, 2023

(51) Int. Cl.
  *H01L 29/08* (2006.01)
  *H01L 23/00* (2006.01)
  *H01L 29/78* (2006.01)
  *H03K 3/03* (2006.01)
  *H10B 10/00* (2023.01)

(52) U.S. Cl.
  CPC ........ *H01L 23/576* (2013.01); *H01L 29/0843* (2013.01); *H01L 29/78* (2013.01); *H03K 3/0315* (2013.01); *H10B 10/12* (2023.02)

(58) Field of Classification Search
  CPC ... H01L 23/576; H01L 29/0843; H01L 29/78; H10B 10/12; H03K 3/0315
  USPC .......................................................... 257/213
  See application file for complete search history.

(56) References Cited

U.S. PATENT DOCUMENTS

| | | | |
|---|---|---|---|
| 7,259,421 B2 | 8/2007 | Hur et al. | |
| 9,500,678 B2 | 11/2016 | Williams | |
| 9,576,914 B2 | 2/2017 | Li et al. | |
| 9,666,582 B1* | 5/2017 | Li | H01L 27/0886 |
| 9,881,995 B2 | 1/2018 | Kocon et al. | |
| 11,482,438 B2* | 10/2022 | Or-Bach | H10B 63/30 |
| 11,532,731 B2* | 12/2022 | Yang | H01L 29/7848 |

\* cited by examiner

*Primary Examiner* — Monica D Harrison
(74) *Attorney, Agent, or Firm* — Erise IP, P.A.

(57) ABSTRACT

Systems, methods, circuits, and devices for providing and using transistors in a physically unclonable function (PUF) circuit. The transistors comprise a split source drain configuration including one or more inflection segments that increase process variations between the transistors such that each transistor generates a unique output signal.

20 Claims, 7 Drawing Sheets

SPLIT SOURCE DRAIN TRANSISTOR

STATEMENT OF GOVERNMENTAL SUPPORT

This invention was made with government support under DE-NA0002839 awarded by the United States Department of Energy/National Nuclear Security Administration. The government has certain rights in the invention.

BACKGROUND

1. Field

Embodiments of the invention relate to field-effect transistors. More specifically, embodiments of the invention relate to field-effect transistors for physical unclonable function circuits.

2. Related Art

Physical unclonable function (PUF) circuits use transistors to provide a unique, randomized, and unclonable signature that may be used for security and authentication purposes. The transistors include a flat uniform channel between a source and drain of the respective transistor with variation parameters limited to threshold voltage, channel length, and overall width. Accordingly, the signal associated with manufacturing variances that provides the unique signature is relatively small and may even be undetectable among inherent electrical noise present in the circuit. As such, prior solutions contemplate placing a large quantity of transistors within the PUF circuit to provide a suitable signal that provides the unique signature.

SUMMARY

Embodiments of the invention solve the above-mentioned problems by providing PUF circuits and transistors with a split source and drain configuration that increases process variation between the transistors. The split source and drain configuration comprises unique geometries that enhance differences in the transistors.

In some aspects, the techniques described herein relate to a field-effect transistor for a physical unclonable function (PUF) circuit including a split source and drain configuration including a source region including at least one source surface inflection segment disposed on an inner surface of the source region, and a drain region disposed adjacent to the source region including at least one drain surface inflection segment disposed on an inner surface of the drain region, wherein the at least one source surface inflection segment and the at least one drain surface inflection segment increase corner or edge effects to thereby increase a manufacturing variability of the field-effect transistor.

In some aspects, the techniques described herein relate to a field-effect transistor, wherein the at least one source surface inflection segment includes a plurality of source surface inflection segments and the at least one drain surface inflection segment includes a plurality of drain surface inflection segments.

In some aspects, the techniques described herein relate to a field-effect transistor, wherein the plurality of source surface inflection segments and the plurality of drain surface inflection segments are arranged in a staircase arrangement.

In some aspects, the techniques described herein relate to a field-effect transistor, wherein the plurality of source surface inflection segments and the plurality of drain surface inflection segments are arranged in a staggered gear teeth arrangement.

In some aspects, the techniques described herein relate to a field-effect transistor, wherein the field-effect transistor is configured to be disposed on a circuit board of the PUF circuit.

In some aspects, the techniques described herein relate to a field-effect transistor, wherein a signal variation associated with the manufacturing variability exceeds an electrical noise associated with the field-effect transistor.

In some aspects, the techniques described herein relate to a field-effect transistor, wherein the field-effect transistor is a metal-oxide-semiconductor field-effect transistor (MOSFET).

In some aspects, the techniques described herein relate to a physical unclonable function (PUF) circuit including a circuit board, and a plurality of field-effect transistors disposed on the circuit board, each field-effect transistor of the plurality of field-effect transistors including a split source and drain configuration including a source region including at least one source surface inflection segment disposed on an inner surface of the source region, and a drain region disposed adjacent to the source region including at least one drain surface inflection segment disposed on an inner surface of the drain region, wherein the at least one source surface inflection segment and the at least one drain surface inflection segment increase corner or edge effects to thereby increase a manufacturing variability of the field-effect transistor.

In some aspects, the techniques described herein relate to a PUF circuit, wherein the PUF circuit includes a printed circuit board fabricated using a printing process.

In some aspects, the techniques described herein relate to a PUF circuit, wherein the PUF circuit is integrated into an arbiter or other types of PUF device.

In some aspects, the techniques described herein relate to a PUF circuit, wherein the plurality of field-effect transistors includes a set of four field-effect transistors with one field-effect transistor of the set of four field-effect transistors disposed at each corner of the PUF circuit.

In some aspects, the techniques described herein relate to a PUF circuit, wherein the at least one source surface inflection segment includes at least one rounded edge.

In some aspects, the techniques described herein relate to a PUF circuit, wherein each field-effect transistor of the plurality of field-effect transistors is manufactured with a reduced-resolution mesh.

In some aspects, the techniques described herein relate to a PUF circuit, wherein a configuration of the at least one source surface inflection segment and the at least one drain surface inflection segment are randomly selected from a plurality of potential configurations.

In some aspects, the techniques described herein relate to an electrical circuit including a circuit board, and a plurality of field-effect transistors disposed on the circuit board, each field-effect transistor of the plurality of field-effect transistors including a split source and drain configuration including a source region including at least one source surface inflection segment disposed on an inner surface of the source region, and a drain region disposed adjacent to the source region including at least one drain surface inflection segment disposed on an inner surface of the drain region, wherein the at least one source surface inflection segment and the at least one drain surface inflection segment increase corner effects to thereby increase a manufacturing variability of the field-effect transistor.

In some aspects, the techniques described herein relate to an electrical circuit, wherein the electrical circuit is integrated into a static random-access memory (SRAM) device.

In some aspects, the techniques described herein relate to an electrical circuit, wherein the electrical circuit is integrated into a ring oscillator device.

In some aspects, the techniques described herein relate to an electrical circuit, wherein the electrical circuit is integrated into an application-specific integrated circuit (ASIC).

In some aspects, the techniques described herein relate to an electrical circuit, wherein the electrical circuit is communicatively coupled to an authentication data store configured to store authentication output data to thereby authenticate the electrical circuit.

In some aspects, the techniques described herein relate to an electrical circuit, further including at least one controller electrically coupled to the plurality of field-effect transistors, the at least one controller controlling activation of the plurality of field-effect transistors during an authentication routine of the electrical circuit.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the technology can include a variety of combinations and/or integrations of the embodiments described herein.

Embodiments are contemplated including PUF circuits and transistors with a split source and drain configuration that increases process variation between the transistors. The split source and drain configuration comprises unique geometries that enhance differences in the transistors compared to standard transistors, as will be described in further detail below.

Figure 1:
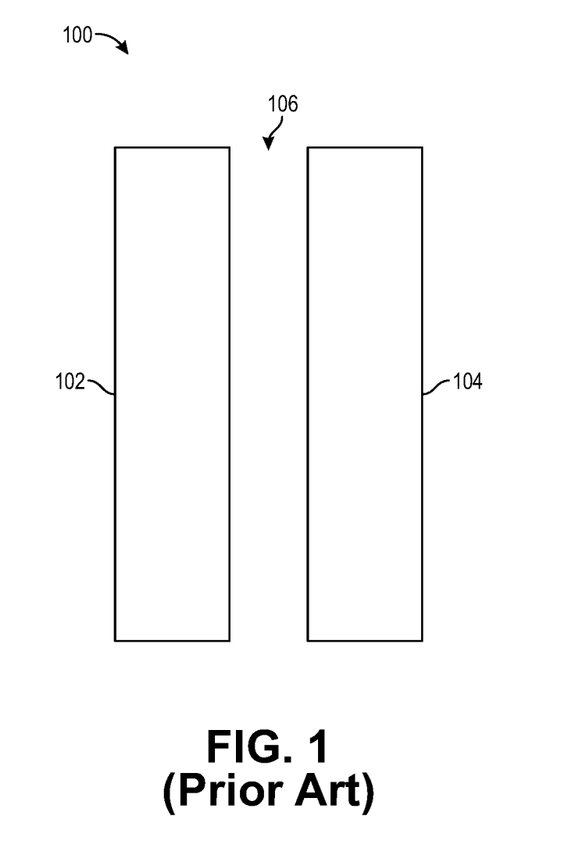
FIG. 1 illustrates an exemplary transistor of the prior art.

FIG. 1 illustrates an exemplary transistor 100 relating to the prior art. In some cases, the transistor 100 may be included within a circuit such as a physical unclonable function (PUF) circuit. The transistor 100 includes a source 102 and a drain 104 separated by a channel 106. The source 102 and the drain 104 each include a flat inner surface that is substantially uniform. Accordingly, physical variations in the transistor 100 are limited to channel length and minor surface defects. However, the signal change from these surface defects is relatively small such that the signal may be difficult to read given electrical noise present within the circuit. As such, circuits including a large quantity of transistors 100 may be used to achieve a suitable signal variation.

The flat uniform surfaces of the source 102 and drain 104 of the transistor 100 provide fairly uniform characteristics across different transistors. Accordingly, as described above, a large quantity of transistors 100 may be necessary to overcome electrical noise. However, embodiments herein contemplate introducing unique geometries into the transistor that enhance variations such that fewer transistors are needed to provide a similar output signal. In some embodiments, a split source and drain configuration is contemplated that includes a non-uniform inner surface, as will be described in further detail below.

Figure 2A:
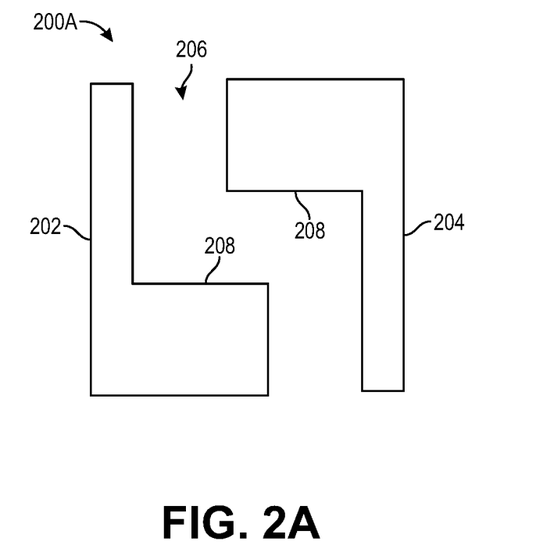
FIG. 2A illustrates an exemplary split source and drain transistor relating to some embodiments.

FIG. 2A illustrates an exemplary transistor 200A relating to some embodiments. In some embodiments, the transistor 200A comprises a split source and drain configuration including a source region 202 and a drain region 204 disposed adjacently to one another, as shown. The split source and drain configuration, characterized by the non-uniform and asymmetrical geometries of the source region 202 and the drain region 204, varies from the flat uniform surface of the transistor 100, described above. Here, the non-uniform structure of the split source and drain configuration enhances the variability of the transistor 200A. The source region 202 and the drain region 204 are separated by a channel 206, as shown. In some embodiments, the source region 202 comprises at least one inflection segment 208, as shown, disposed on an inner surface of the source region 202. Additionally, in some embodiments, the drain region 204 comprises at least one inflection segment 208 disposed on an inner surface of the drain region 204.

In some embodiments, the inflection segments 208 comprise variations in the surface geometry of either of the source region 202 or the drain region 204. In some embodiments, the inflection segments 208 comprise an L-shaped geometry that protrudes into the channel 206. Accordingly, in some embodiments, the transistor 200 comprises a variable channel length that varies over a width of the channel 206 based on the geometry of the inflection segments 208. For example, the inflection segments 208 may protrude into the channel 206 to thereby offset the channel length in various locations across the width of the channel 206. Further, in some embodiments, the channel shape is non-uniform and is changed by the inclusion of the inflection segments 208.

In some embodiments, the inflection segments 208 enhance the variability of the transistor 200A and/or introduce additional variability attributed to the difficulty in consistently producing the geometries associated with the inflection segments 208. For example, in some embodiments, the inflection segments 208 provide additional structural complexity, which thereby increases manufacturing variability. Accordingly, the inflection segments 208 increase signal variability between individual transistors, which may be manufactured using the same pattern or mesh, thereby providing the physically unforgeable and unique signal response suitable for PUF applications. In some embodiments, the inflection segments 208 may protrude from the inner surface of the source or drain at about a 90-degree angle. In some embodiments, the 90-degree angle of the inflection segment 208 increases corner effects and edge roughness of the transistor 200, which increases the variability. In some embodiments, the angle of the any of the inflection segment 208 may be selected from the range of 80-degrees to 100-degrees. It should be understood that other angles are also contemplated for the inflection segment 208. For example, in some embodiments, angles may be selected between 45-degrees and 135-degrees. However, embodiments are contemplated in which other suitable angles may be selected. Further, in some embodiments, the structural change imparted by the inflection segments 208 increases electronic entropy and amplifies variations within the transistor 200. In some such embodiments, a signal variation of the transistor associated with the manufacturing variability provided by the inclusion of the inflection segments 208 exceeds the electrical noise present in the transistor.

Figure 2B:
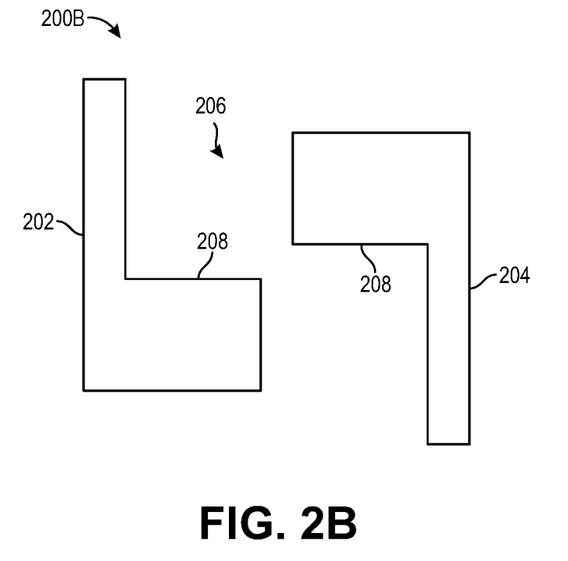
FIG. 2B illustrates an exemplary split source and drain transistor relating to some embodiments.

FIG. 2B illustrates an exemplary transistor 200B relating to some embodiments. In some embodiments, similar to as described above with respect to transistor 200A, the transistor 200B comprises the source region 202 and the drain region 204 separated by the channel 206 and a plurality of inflection segments 208, as shown. However, in the transistor 200B, the source region 202 and drain region 204 may be positioned and oriented such that the corners of the inflection segments 208 are positioned adjacently, as shown. As such, the open channel 206 becomes narrowest between the corners of the inflection segments. Accordingly, the current density may be dominated by the two sharp edges of the corners of the inflection segments 208, which are the closest point between the source region 202 and the drain region 204. In some cases, the edge and corner effects increase the variability compared to other configurations of the source and drain, such as in transistor 200A. Alternatively, or additionally, embodiments are contemplated in which the source region 202 and the drain region 204 are positioned and oriented differently. For example, the source region 202 and drain region 204 may be positioned closer together such that the inflection segments 208 overlap and the corners are not the closest points.

Figure 2C:
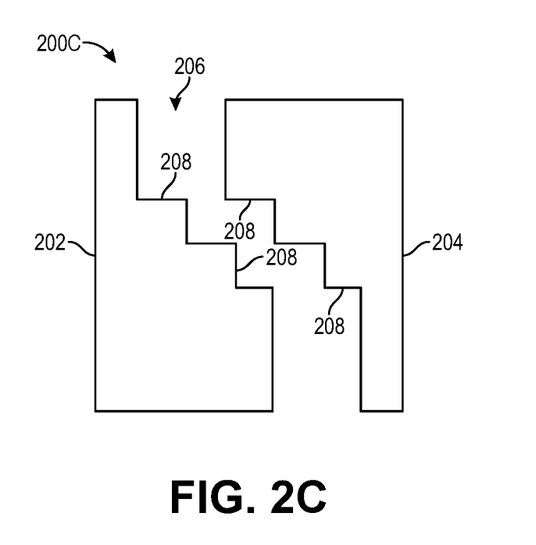
FIG. 2C illustrates an exemplary split source and drain transistor relating to some embodiments.

FIG. 2C illustrates an exemplary transistor 200C relating to some embodiments. In some embodiments, the transistor 200C comprises the source region 202 and the drain region 204 separated by the channel 206 and a plurality of inflection segments 208, as shown. In some embodiments, the plurality of inflection segments 208 are arranged in a staircase configuration, as shown. Accordingly, the plurality of inflection segments 208 vary the channel length across the width of the transistor 200C to thereby increase the variability of the transistor 200C.

In some embodiments, each inflection segments 208 is arranged in the staircase configuration such that the inflection segments 208 on the source region 202 correspond with the inflection segments 208 of the drain region 204. In some embodiments, space is provided between the corresponding inflection segments 208 of the source region 202 and the drain region 204 such that the channel 206 is preserved. Accordingly, the source region 202 does not directly contact the drain region 204. In some embodiments, the transistor 200C comprises any number of inflection segments 208.

Figure 2D:
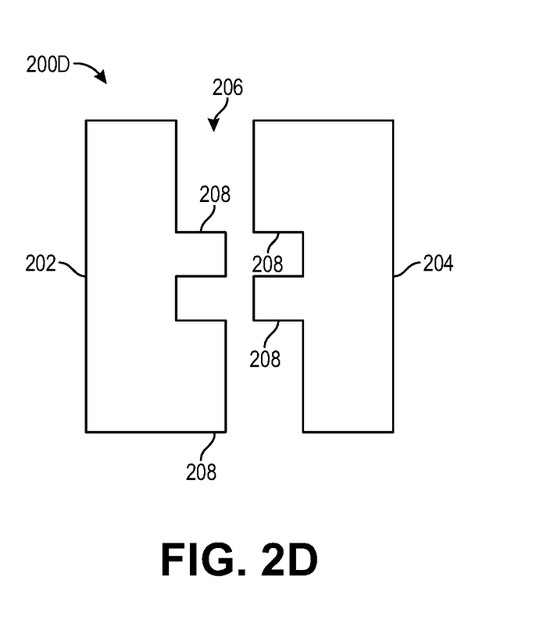
FIG. 2D illustrates an exemplary split source and drain transistor relating to some embodiments.

FIG. 2D illustrates an exemplary transistor 200D relating to some embodiments. In some embodiments, the transistor 200D comprises the source region 202 and the drain region 204 separated by the channel 206 and a plurality of inflection segments 208. In some embodiments, the inflection segments 208 are arranged in an interlocking configuration, as shown. In some embodiments, the inflection segments 208 may be arranged similarly to interlocking gear teeth. However, in such embodiments, the corresponding inflection segments 208 of the source region 202 and the drain region 204 do not come into direct contact with one another. In some embodiments, the exemplary transistor 200D may comprise any number of inflection segments 208 arranged in a staggered gear teeth configuration.

It should be understood that a variety of additional geometries of the split source and drain configurations are contemplated. For example, the split source and drain transistors referred to generally herein by reference numeral 200 may include any of circular rings, complex additively manufactured geometries, curved edges, triangular sections, fractal geometries, and other suitable geometries with modified source regions 202 and drain regions 204 having various different forms of inflection segments 208. Further, embodiments are contemplated in which any type of polygonal shape may be included to produce inflection segments 208 on the transistor 200. In some embodiments, process variations may be maximized by increasing the number of inflection segments 208 present in the transistor 200. Further, in some embodiments, 3-dimensional geometries are also contemplated. For example, cubic source and drain configurations, spherical source and drain configurations, and other 3-dimensional configurations.

In some embodiments, the specific geometry of the transistor 200 may be randomized. For example, embodiments are contemplated in which the configuration of the at least one surface inflection segment 208 may be randomly selected from a plurality of potential configurations. For example, the plurality of configurations may include any of the transistor configurations described above including the transistors 200A, 200B, 200C, and 200D.

In some embodiments, the transistor 200 may be integrated into a PUF circuit to provide authentication based on a unique unclonable response. However, it should be understood that the transistors 200 described herein may be implemented within other applications. For example, in some embodiments, the transistor 200 may be used to provide random number generation or other related utilities that depend on unique unpredictable variations.

Figure 3:
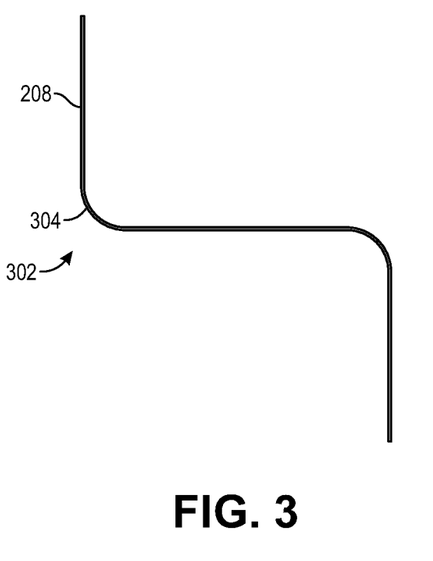
FIG. 3 illustrates an exemplary zoomed in view of an inflection segment relating to some embodiments.

FIG. 3 illustrates an exemplary zoomed in view of an inflection segment 208 relating to some embodiments. In some embodiments, the inflection segment 208 includes a corner 302 including a rounded portion 304, as shown. In some embodiments, a number of different manufacturing techniques are contemplated for the transistor 200. For example, in some embodiments, the transistor 200 may be fabricated using a printing technique. Here, any combination of photolithography, oxidation, deposition, ion implantation, and etching techniques may be used to fabricate the transistor 200. However, it should be understood that other suitable semiconductor fabrication techniques not explicitly described herein may be used.

In some embodiments, a mesh may be generated for printing the transistor 200. In some such embodiments, the mesh may be a 2-dimensional mesh representing the intended transistor 200. However, variations may be present within the actual printed transistor 200. For example, the corner of the transistor 200 may be intended to comprise a 90-degree angle based on the provided mesh, but is actually at least partially rounded, as shown. Accordingly, because the sharp edge 90-degree angle may be challenging to fabricate for certain manufacturing processes, the rounded edges produce signal variations that will be unique to each individual transistor 200. Here, the variation is derived from differences between the transistor as-designed versus the transistor, as-fabricated or between two or more separate fabricated transistors. The varied rounded edges produce a unique signal path through the channel 206. Specifically, the signal path will vary based on the unique channel length produced by the varied rounded edges, which is distinct from the typical uniform channel length present in typical flat source and drain transistors.

In some embodiments, advantage is taken of the inherent variations in the printing process to provide unique structural defects. Further, embodiments are contemplated in which a printing resolution of the printing process or a mesh resolution associated with the mesh is adjusted to enhance the structural variation of the inflection segments 208. For example, the resolution of a mesh used to manufacture the transistor 200 may be intentionally reduced to thereby increase variation between individual transistors 200. For example, in some embodiments, the printing resolution may be selected from around 20 μm or between 10 μm and 30 μm.

Figure 4:
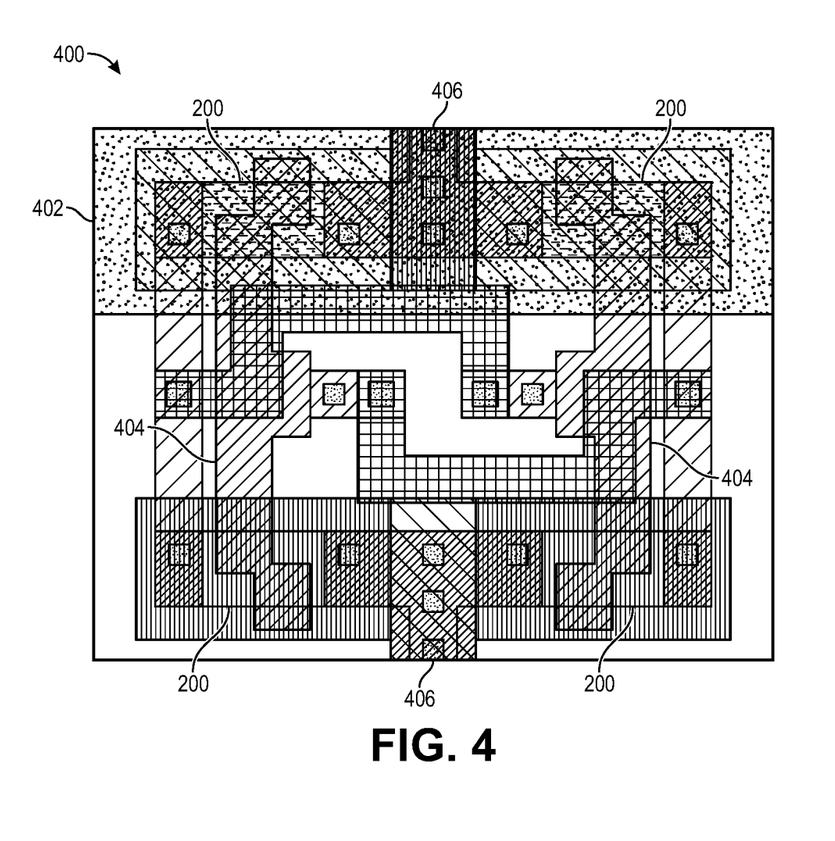
FIG. 4 illustrates an exemplary electrical circuit relating to some embodiments.

FIG. 4 illustrates an exemplary electrical circuit 400 relating to some embodiments. In. some embodiments, the electrical circuit 400 is a physical unclonable function (PUF) circuit configured to generate a unique unclonable signal using the inflection segments 208, as described above. In some such embodiments, the PUF circuit may be integrated into a range of applications including any of static random-access memory (SRAM), ring oscillator, and arbiter PUFs, as well as other suitable application using unclonable signals. Here, the signal may include any of a threshold voltage, a drain-source current, or drain-source resistance, as well as other suitable electrical parameters. In one example, the electrical circuit 400 may be incorporated into an arbiter PUF system such that a time difference of two or more delay line signals is used to authenticate the arbiter PUF system.

In some embodiments, the PUF circuit may be integrated into a smart card or integrated circuit chip for providing a unique signature or digital fingerprint to thereby authenticate the PUF circuit. For example, the output of the PUF circuit may be identified as a signature for identifying the PUF circuit. Further, in some embodiments, the electrical circuit 400 described herein may be incorporated into an application-specific integrated circuit (ASIC). In some embodiments, the electrical circuit 400 comprises a printed circuit board (PCB). Accordingly, for example, the components of the electrical circuit 400 may be printed or etched directly onto a substrate surface.

In some embodiments, the electrical circuit 400 comprises one or more transistors 200 disposed on a circuit board 402. In some embodiments, the one or more transistors 200 include any of the transistors 200A, 200B, 200C and 200D relating to FIGS. 2A, 2B, 2C, and 2D respectively. In some embodiments, the electrical circuit 400 may comprise a combination of different types of transistors such as the transistor 200A and the transistor 200C. In some such embodiments, at least one of the transistors 200 is a metal-oxide-semiconductor field-effect transistor (MOSFET). Further, in some embodiments, the electrical circuit 400 comprises one or more electrical channels 404. In some embodiments, the one or more electrical channels 404 are disposed between the source and drain of the transistors 200, as shown. In some embodiments, a plurality of transistors 200 are included in the electrical circuit 400. For example, in some embodiments, four transistors 200 may be included, as shown, with a transistor 200 at each corner of the electrical circuit 400. Alternatively, or additionally, embodiments are contemplated in which a single transistor 200 may be included in the circuit 400. Further, in some embodiments, two or three transistors 200 may be included. In some embodiments, a larger number of transistors corresponds to a relatively larger signal variation of the electrical circuit. However, it should be understood that the split source and drain configuration allows fewer transistors to achieve a comparable signal variation to a substantially larger number of transistors of a standard configuration.

In some embodiments, the electrical circuit 400 comprises one or more nodes 406. In some such embodiments, the nodes 406 are configured to provide an electrical connection with one or more outside sources. In some embodiments, the nodes 406 may be configured to receive an input signal that initiates a test of the electrical circuit 400. Additionally, the nodes may be operable to transmit an output of the electrical circuit 400.

In some embodiments, the electrical circuit 400 may be used as a PUF circuit to provide a unique unclonable signature, as described above. In some such embodiments, the electrical circuit 400 may be used in a challenge-response authentication process. Here, an input signal may be provided to the electrical circuit 400 requesting a specific output signal that is unique to the electrical circuit 400 based on the variations provided by the transistors 200. Another potential application of the electrical circuit 400 may be key generation and storage for an authentication key service.

In some embodiments, the electrical circuit 400 may be supplied with electrical power to initiate a transistor test of the one or more transistors 200. Accordingly, a voltage may be provided to the electrical circuit 400 to activate the one or more transistors 200. In some embodiments, the voltage may be provided using one or more of the nodes 406. Further, in some embodiments, an output voltage may be read from one or more of the transistors 200. Accordingly, the output voltage or a series of output voltages may be used to authenticate the electrical circuit 400 based on a known output. The output may be unique for each electrical circuit 400 due to the process variations associated with the inflection segments 208 described above. Further, embodiments are contemplated in which a series of input voltages may be tested against a series of outputs. In some embodiments, after manufacturing the electrical circuit 400 may be initially tested and the unique outputs may be stored in a data store such that they may be retrieved for authentication.

It should be understood that, in some embodiments, the electrical circuit 400 may be incorporated into a larger circuit or into a circuit board. For example, in some embodiments, the electrical circuit 400 is integrated into a microchip or other device to provide authentication functionality in said device.

Figure 5:
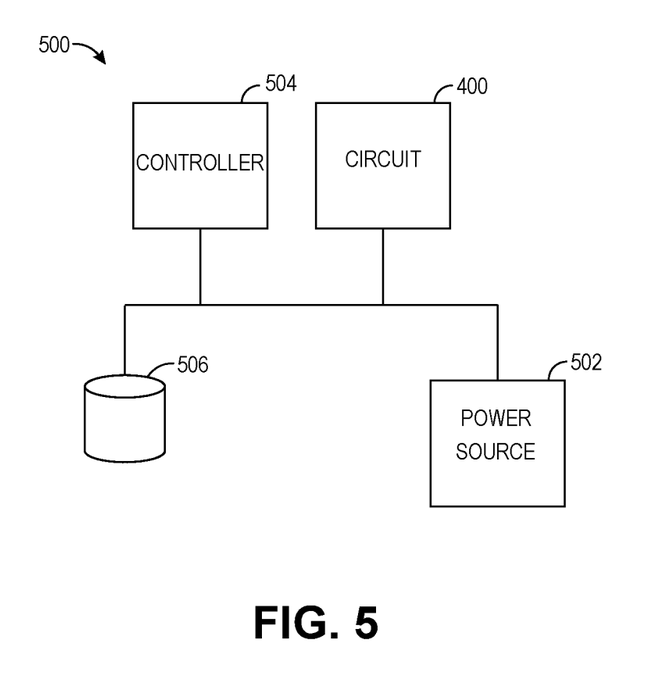
FIG. 5 illustrates an exemplary system relating to some embodiments.

FIG. 5 illustrates an exemplary system 500 relating to some embodiments. In some embodiments, the system 500 comprises the electrical circuit 400, a power source 502, a controller 504, and a data store 506, as shown. In some such embodiments, the power source 502 may be configured to provide electrical power to any of the electrical circuit 400, the controller 504 and the data store 506. Accordingly, in some embodiments, the power source 502 may include any combination of a battery, a capacitor, or another suitable electrical power source. Further, embodiments are contemplated in which the power source 502 may be integrated into the electrical circuit 400 or the controller 504.

In some embodiments, the controller 504 may be configured to communicate and monitor the electrical circuit 400. For example, in some embodiments, the controller 504 may be operable to control electrical power and signals transmitted to the electrical circuit 400. The controller 504 may comprises any combination of a processor, a microprocessor, a microcontroller, or any other suitable type of processing unit and/or control unit.

In some embodiments, the data store 506 may be an authentication data store configured to store authentication data associated with the electrical circuit 400. For example, an output or a series of outputs from the electrical circuit 400 may be stored within the data store 506 such that the electrical circuit 400 may be authenticated against stored output data on the data store 506. Accordingly, in some such embodiments, the electrical circuit 400 may be communicatively coupled to the data store 506. In some embodiments, the data store 506 stores a plurality of authentication output data sets corresponding to a respective plurality of unique electrical circuits. In some embodiments, the system 500 employed to execute an authentication routine, as will be described in further detail below with respect to method 600 of FIG. 6.

Figure 6:
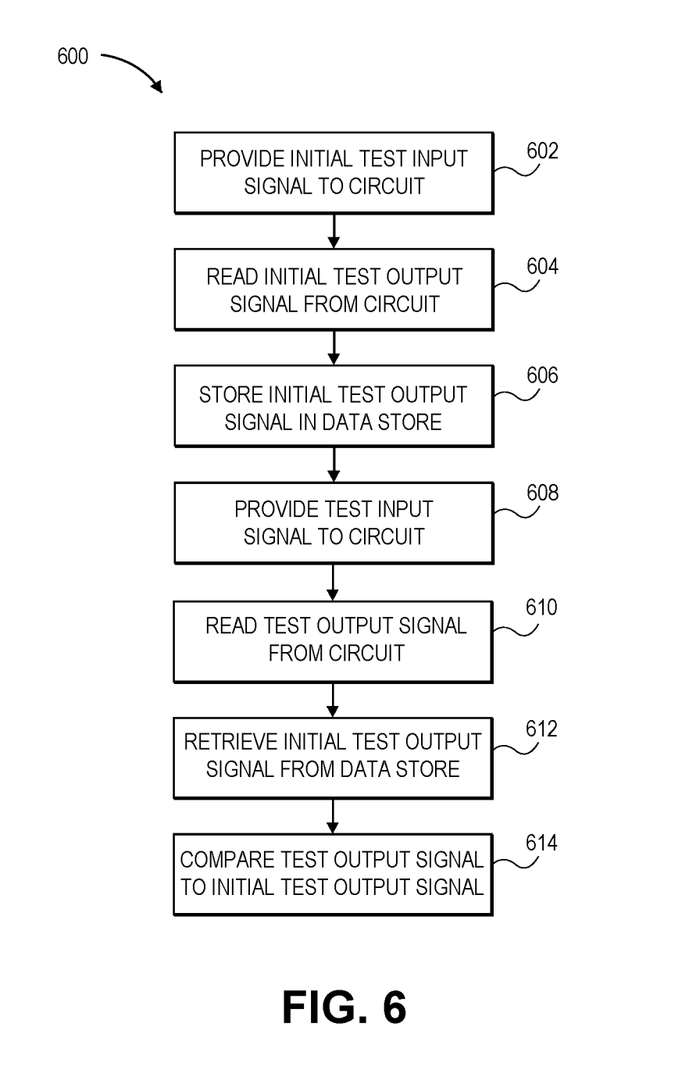
FIG. 6 illustrates a method of performing an authentication routine with an electrical circuit including one or more split source drain transistors.

FIG. 6 illustrates a method 600 of performing an authentication routine with an electrical circuit including one or more split source drain transistors. In some embodiments, the method 600 may be carried out at least in part on the electrical circuit 400 described above and/or in association with the system 500. In some embodiments, the method 600 may be facilitated at least in part by the controller 504 or one or more other controllers and/or processors. For example, processing may be divided such that a first processor performs a first portion of steps and a second processor performs a second portion of steps.

At step 602, an initial test input signal is provided to the circuit. In some embodiments, the initial test input signal may include an electrical signal transmitted to the circuit. In some such embodiments, said electrical signal may be configured to activate the one or more transistors 200 of the electrical circuit 400. In some embodiments, the initial test input signal comprises a single voltage input. For example, a voltage of about 3 volts may be applied to the circuit from a power source such as the power source 502. In some embodiments, the initial test signal may comprise a series of input signals. For example, a series of varying known voltages may be applied to the circuit.

At step 604, an initial test output signal is read from the circuit. In some embodiments, the initial test output signal may be output from the circuit responsive to receiving the initial test input signal. For example, the initial test input signal may activate a portion of the transistors 200 based at least in part on the variations within the respective transistors, producing a unique output signal.

At step 606, the initial test output signal is stored within a data store. In some embodiments, the initial test output signal may be stored within the data store 506. In some embodiments, the initial test output signal may comprise a binary sequence of data. For example, the initial test output signal may include a series of zeros and ones representing activation of the transistors. In some embodiments, steps 602-606 may be carried out as an initial setup of the circuit to store authentication parameters of the circuit to be used in future authentication procedures.

At step 608, a test input signal is provided to the circuit. In some embodiments, the test input signal may be similar to the initial test input signal. At step 610, a test output signal is read from the circuit. In some embodiments, the test output signal is read in response to providing the test input signal. The test output signal may be similar to the initial test output signal. For example, the test output signal may comprise a binary sequence of data.

At step 612, the initial test output signal is retrieved from the data store. In some embodiments, the initial test output signal may be identified based on an identifier associated with the transistor. Additionally, embodiments are contemplated in which the initial test output signal may be identified based on information in the test output signal. For example, the transistor may be self-identifying such that test output signal is matched to the initial test output signal.

At step 614, the test output signal is compared to the initial test output signal to thereby authenticate the circuit. In some embodiments, steps 608-614 may be performed as part of an authentication procedure used to authenticate the circuit. For example, the electrical circuit 400 may be incorporated into a device such as a chip card. Accordingly, the unique output signal provided by the transistors 200 may be used to authenticate the chip card or other device including the electrical circuit 400. In some such embodiments, if the test output signal is similar to the initial test output signal, then the circuit is determined to be authentic. However, if the test output signal is distinct from the initial test output signal, then the circuit is determined to be unauthentic.

In some embodiments, the authentication procedure described above may be used to authenticate an information transaction. Accordingly, if the test output signal is determined to be authentic, the transaction is approved and, if the test output signal is determined to be unauthentic, the transaction is denied. Further still, in some embodiments, the test output signal may be used to decrypt a set of encrypted data such that the physical circuit is used to decipher encrypted information.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by

Letters Patent includes the following:

1. A field-effect transistor for a physical unclonable function (PUF) circuit comprising:
a split source and drain configuration comprising:
a source region including at least one source surface inflection segment disposed on an inner surface of the source region; and
a drain region disposed adjacent to the source region and separated from the source region by a channel, the drain region including at least one drain surface inflection segment disposed on an inner surface of the drain region, the at least one drain surface inflection segment protruding into the channel,
wherein the at least one source surface inflection segment protrudes into the channel,
wherein the at least one drain surface inflection segment is offset from the at least one source surface inflection segment along a length of the channel, and
wherein the at least one source surface inflection segment and the at least one drain surface inflection segment increase corner effects to thereby increase a manufacturing variability of the field-effect transistor.

2. The field-effect transistor of claim 1, wherein the at least one source surface inflection segment includes a plurality of source surface inflection segments and the at least one drain surface inflection segment includes a plurality of drain surface inflection segments.

3. The field-effect transistor of claim 2, wherein the plurality of source surface inflection segments and the plurality of drain surface inflection segments are arranged in a staircase arrangement.

4. The field-effect transistor of claim 2, wherein the plurality of source surface inflection segments and the plurality of drain surface inflection segments are arranged in a staggered gear teeth arrangement.

5. The field-effect transistor of claim 1, wherein the field-effect transistor is configured to be disposed on a circuit board of the PUF circuit.

6. The field-effect transistor of claim 1, wherein a signal variation associated with the manufacturing variability exceeds an electrical noise associated with the field-effect transistor.

7. The field-effect transistor of claim 1, wherein the field-effect transistor is a metal-oxide-semiconductor field-effect transistor (MOSFET).

8. A physical unclonable function (PUF) circuit comprising:
a circuit board; and
a plurality of field-effect transistors disposed on the circuit board, each field-effect transistor of the plurality of field-effect transistors comprising:
a split source and drain configuration comprising:
a source region including at least one source surface inflection segment disposed on an inner surface of the source region; and
a drain region disposed adjacent to the source region and separated from the source region by a channel, the drain region including at least one drain surface inflection segment disposed on an inner surface of the drain region, the at least one drain surface inflection segment protruding into the channel,
wherein the at least one source surface inflection segment protrudes into the channel,
wherein the at least one drain surface inflection segment is offset from the at least one source surface inflection segment along a length of the channel, and
wherein the at least one source surface inflection segment and the at least one drain surface inflection segment increase corner effects to thereby increase a manufacturing variability of the field-effect transistor, and
wherein the field-effect transistor is configured to provide an authentication output signal for authenticating the PUF circuit.

9. The PUF circuit of claim 8, wherein the PUF circuit comprises a printed circuit board fabricated using a printing process.

10. The PUF circuit of claim 8, wherein the PUF circuit is integrated into an arbiter PUF device.

11. The PUF circuit of claim 8, wherein the plurality of field-effect transistors comprises a set of four field-effect transistors with one field-effect transistor of the set of four field-effect transistors disposed at each corner of the PUF circuit.

12. The PUF circuit of claim 8, wherein the at least one source surface inflection segment comprises at least one rounded edge.

13. The PUF circuit of claim 8, wherein each field-effect transistor of the plurality of field-effect transistors is manufactured with a reduced-resolution mesh compared to a standard mesh.

14. The PUF circuit of claim 8, wherein a configuration of the at least one source surface inflection segment and the at least one drain surface inflection segment are randomly selected from a plurality of potential configurations.

15. An electrical circuit comprising:
a circuit board; and
a field-effect transistor disposed on the circuit board, the field-effect transistor comprising:
a split source and drain configuration comprising:
a source region including at least one source surface inflection segment disposed on an inner surface of the source region; and
a drain region disposed adjacent to the source region and separated from the source region by a channel, the drain region including at least one drain surface inflection segment disposed on an inner surface of the drain region, the at least one drain surface inflection segment protruding into the channel,
wherein the at least one source surface inflection segment protrudes into the channel,
wherein the at least one drain surface inflection segment is offset from the at least one source surface inflection segment along a length of the channel, and
wherein the at least one source surface inflection segment and the at least one drain surface inflection segment increase corner effects to thereby increase a manufacturing variability of the field-effect transistor.

16. The electrical circuit of claim 15, wherein the electrical circuit is integrated into a static random-access memory (SRAM) device.

17. The electrical circuit of claim 15, wherein the electrical circuit is integrated into a ring oscillator device.

18. The electrical circuit of claim 15, wherein the electrical circuit is integrated into an application-specific integrated circuit (ASIC).

19. The electrical circuit of claim 15, wherein the electrical circuit is communicatively coupled to an authentication data store configured to store authentication output data to thereby authenticate the electrical circuit.

20. The electrical circuit of claim 19, further comprising:
at least one controller electrically coupled to the field-effect transistor, the at least one controller controlling activation of the field-effect transistor during an authentication routine of the electrical circuit.

\* \* \* \* \*